United States Patent [19]
Kim et al.

[11] Patent Number: 5,146,110
[45] Date of Patent: Sep. 8, 1992

[54] SEMICONDUCTOR MEMORY WITH SUBSTRATE VOLTAGE GENERATING CIRCUIT FOR REMOVING UNWANTED SUBSTRATE CURRENT DURING PRECHARGE CYCLE MEMORY MODE OF OPERATION

[75] Inventors: Tae-Jin Kim, Seoul; Kyu-Chan Lee, Ansan, both of Rep. of Korea

[73] Assignee: Samsung Electronics Co., Ltd., Suweon, Rep. of Korea

[21] Appl. No.: 736,577

[22] Filed: Jul. 26, 1991

[30] Foreign Application Priority Data

May 22, 1991 [KR] Rep. of Korea ............... 91-8266[U]

[51] Int. Cl.$^5$ .............................................. H03K 5/01
[52] U.S. Cl. .............................. 307/296.2; 307/296.1; 307/296.8; 365/189.09
[58] Field of Search ............... 307/296.1, 296.2, 296.8; 365/189.09

[56] References Cited

U.S. PATENT DOCUMENTS

| | | | |
|---|---|---|---|
| 4,142,114 | 2/1979 | Green | 307/296.2 |
| 4,628,214 | 12/1986 | Leuschner | 307/296.2 |
| 4,820,936 | 4/1989 | Veendrick et al. | 307/296.2 |
| 5,003,511 | 3/1991 | Secol et al. | 307/296.8 |
| 5,021,680 | 6/1991 | Zaw Win et al. | 307/296.1 |
| 5,041,739 | 8/1991 | Goto | 307/296.2 |

FOREIGN PATENT DOCUMENTS 0186672  7/1990  Japan ............... 307/295.2

Primary Examiner—Stanley D. Miller
Assistant Examiner—Scott A. Ouellette
Attorney, Agent, or Firm—Cushman, Darby & Cushman

[57] ABSTRACT

A semiconductor memory device having a substrate voltage production circuit comprises a time delay circuit. The time delay circuit of the present invention has a simple construction and is provided to facilitate removal of an unwanted substrate current $I_{SUB}$ existing during a precharge cycle of memory operation. The substrate voltage production circuit requires no additional regulating signals for operation. Latch-up conditions commonly caused by such unwanted substrate currents are eliminated and stable semiconductor memory device operation is achieved.

3 Claims, 1 Drawing Sheet

SEMICONDUCTOR MEMORY WITH SUBSTRATE VOLTAGE GENERATING CIRCUIT FOR REMOVING UNWANTED SUBSTRATE CURRENT DURING PRECHARGE CYCLE MEMORY MODE OF OPERATION

BACKGROUND OF THE INVENTION

1. Field of the Invention

The present invention relates to a semiconductor memory device having a substrate voltage production circuit which includes a time delay circuit for removing substrate current $I_{SUB}$ during both precharge cycle time and active cycle time of a clock period.

2. Background Information

Generally, a substrate current $I_{SUB}$ is generated during normal operation of a semiconductor memory device.

If the substrate current $I_{SUB}$ is not effectively removed by a substrate voltage production circuit, the semiconductor memory device is likely to latch up under normal operating conditions and an erroneous operation may occur.

Accordingly, removing of the substrate current $I_{SUB}$ is a main focus in semiconductor memory design where stable operation and fast speed is critical.

In the past, in connection with DRAM technology, a substrate current $I_{SUB}$ exists at two select specified time orders.

As shown in FIG. 3, a substrate current of a first time order is generated when a sense amplifier (S/A) 3 develops data to be stored in memory cell MC comprising transistor M$\phi$ and capacitor C1 (active cycle).

After an external chip selection signal is disabled (precharge cycle) and an equalizing signal $\phi$ EQ on bit lines B/L, B/L is enabled, transistors M$_1$, M$_2$ and M$_3$ equalize bit lines B/L, B/L completely. As much as $\frac{1}{2}$ Vcc (Vcc is an operating power source voltage) develops across the bit lines to generate a substrate current at a second time order. The substrate voltage production circuit for removing unwanted substrate current $I_{SUB}$ is in stand-by mode when a capacitance of supply source voltage is small (i.e., precharge cycle) and in active mode when the capacitance of supply source voltage is large (i.e., active cycle).

Conventionally, the stand-by mode is always operational, however, the active mode of the substrate voltage production circuit is operational only during the active cycle of semiconductor memory access.

Hence, because the cycle generating the substrate current of a first time order is the active cycle of memory operation, both substrate voltage production circuit stand-by mode and active mode are operational.

Thus, the unwanted substrate current $I_{SUB}$ is effectively removed by the substrate voltage production circuit.

However, during the precharge cycle when the substrate current $I_{SUB}$ is also known to be increasingly generated the substrate voltage production circuit is not-operational with respect to the active mode.

As discussed above, unremoved substrate current during the precharge cycle can lead to the problem of latch up and erroneous memory operation.

SUMMARY OF THE INVENTION

Accordingly, the present invention was made so as to solve the above-mentioned problem.

An object of the present invention is to provide a semiconductor memory device with stable operation. The present invention includes a time delay circuit to decrease the possibility of latch-up in a semiconductor memory chip by removing a substrate current $I_{SUB}$.

A substrate voltage production circuit normally in the active mode of operation is made operative during at least a portion of a precharge cycle under the control of the time delay circuit.

To achieve the above object, a semiconductor memory device is provided with substrate voltage production circuit which comprises a time delay circuit DP including a plurality of inverters connected in series, a NOR gate and an inverter, a $V_{BB}$ generator circuit 2 for stand-by mode of operation.

The time delay circuit part DP inputs an external chip selection signal and utilizes an active master signal $\phi$RM. $\phi$RM is delayed a predetermined duration of time in a given cycle such that a substrate current $I_{SUB}$ can be removed by allowing the operation of the $V_{BB}$ Generator circuit 1 for active mode of operation to operate during a precharge cycle.

BRIEF DESCRIPTION OF THE DRAWINGS

The above object and feature of the present invention will be apparent from the following description of the preferred embodiment with reference to the accompanying drawings.

DETAILED DESCRIPTION OF THE INVENTION

A detailed description will be given regarding a constitution, function and effect of the present invention with reference to the attached figures.

Figure 1:
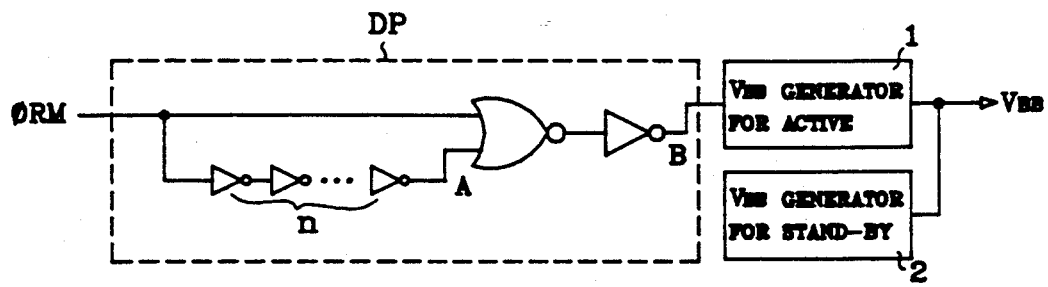
FIG. 1 is a diagram showing an embodiment of a substrate voltage production circuit according to the present invention.
Figure 2:
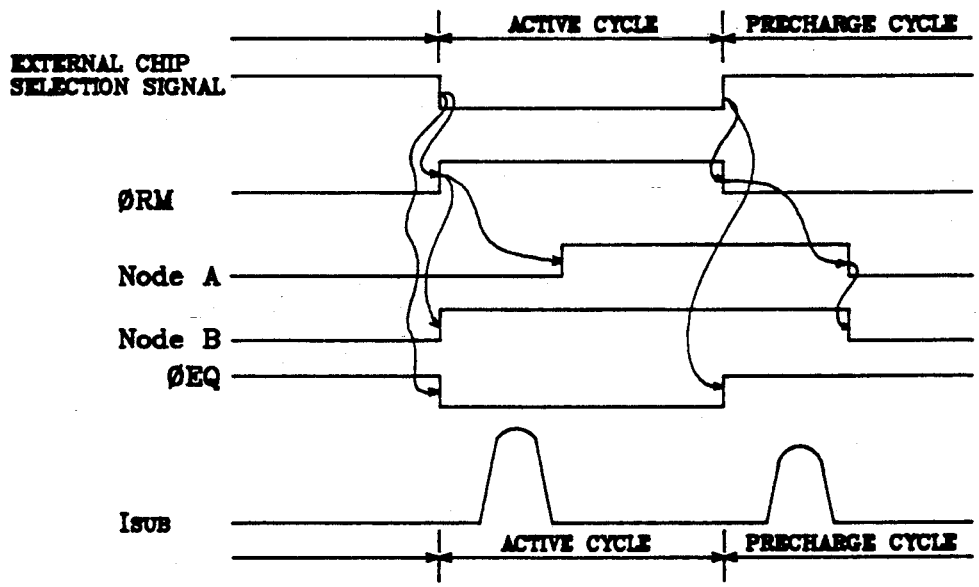
FIG. 2 is a timing chart showing operation of the present invention in connection with the substrate voltage production circuit of FIG. 1.
Figure 3:
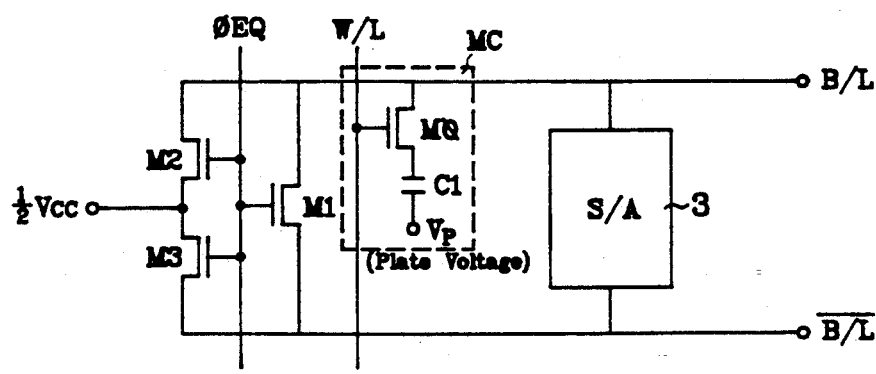
FIG. 3 is a diagram showing a portion of a DRAM memory cell array.

FIG. 1 shows a substrate voltage production circuit with a time delay circuit in connection with the present invention. FIG. 2 is a timing diagram showing an operation of the substrate voltage production circuit according to the present invention.

As shown in FIGS. 1 and 2, an active master signal $\phi$RM is generated by in response to an external chip selection signal. As signal $\phi$RM passes through the time delay circuit DP which is constructed with a plurality of inverters connected in series, a NOR gate and an inverter, active master signal $\phi$RM (at a point A in FIG. 1) has a waveform characteristic that is delayed a predetermined duration of time (see node A shown in FIG. 2). Similarly, signal $\phi$RM at point B in FIG. 1 forms a delayed waveform shown as node B in FIG. 2.

The number of inverters determines how long the active master signal $\phi$RM delay duration will last. Since the substrate current $I_{SUB}$ is effectively removed by $V_{BB}$ Generator Circuit 1 active mode, the delay extends its operation into the next cycle of the memory access period.

A description of the operation of the present invention will be given hereinafter.

If an external chip selection signal is enabled active "low", $V_{BB}$ Generator Circuit 1 for active mode gates the active master signal $\phi$RM which is similarly enabled by the output stage of the plurality of inverters and NOR gate of the DP circuit.

The substrate voltage production circuit can be operated by the active master signal $\phi RM$ directly gated to the NOR gate.

After the active cycle of memory operation has elapsed, the active master signal $\phi RM$ becomes disabled. However, the delayed waveform shown by node A of FIG. 2 and driven by time delay circuit DP continuous to drive $V_{BB}$ Generator Circuit 1 for active mode well into the next cycle (precharge cycle).

The $V_{BB}$ Generator Circuit 2 stand-by mode continues to run under oscillator control and provides precharge $V_{BB}$ for DRAM memory access operation.

Therefore, a substrate voltage production circuit having a time delay circuit in accordance with the present invention has a simple construction which can easily remove a substrate current $I_{SUB}$ during precharge cycle without creating a need for additional regulating signals.

As a result, latch-up problems due to unwanted substrate currents are obviated providing a semiconductor memory device having stable operation.

The present invention is not limited to the above embodiment, and variations and modifications may be made without departing from the scope of the present invention.

What is claimed is:

1. A substrate voltage generating circuit in a semiconductor memory device having at least one clock period comprising a memory active cycle and a memory precharge cycle, said substrate voltage generating circuit comprising:

time delay circuit means having a plurality of inverters connected in series, a NOR gate and an inverter for generating a delay signal in response to an active cycle of said at least one clock period;

active mode substrate voltage generating means for generating an active voltage signal, in response to said delay signal, to remove a substrate current $I_{SUB}$ from a memory array portion, said delay signal generating said active voltage signal during at least a portion of a memory precharge cycle;

stand-by substrate voltage generating means for generating a stand-by signal to said memory array portion, said stand-by signal being active at least during a portion of the memory precharge cycle when said active voltage signal is disabled.

2. The substrate voltage generating circuit of claim 1, wherein a duration in delay of said signal is related to the number of said plurality of inverters.

3. The substrate voltage generating circuit of claim 1, wherein the active voltage signal is enabled when said stand-by signal is enabled so as to simultaneously enabled for a duration of each clock period.

* * * * *